US008579272B2

(12) United States Patent
Li et al.

(10) Patent No.: US 8,579,272 B2
(45) Date of Patent: Nov. 12, 2013

(54) CLAMPING APPARATUS

(75) Inventors: Shen-Chun Li, Taipei Hsien (TW);
Shou-Kuo Hsu, Taipei Hsien (TW);
Hsien-Chuan Liang, Taipei Hsien (TW)

(73) Assignee: Hon Hai Precision Industry Co., Ltd., New Taipei (TW)

( * ) Notice: Subject to any disclaimer, the term of this patent is extended or adjusted under 35 U.S.C. 154(b) by 772 days.

(21) Appl. No.: 12/825,416

(22) Filed: Jun. 29, 2010

(65) Prior Publication Data
US 2011/0260385 A1  Oct. 27, 2011

(30) Foreign Application Priority Data
Apr. 27, 2010 (TW) .............................. 99113349 A

(51) Int. Cl.
*B23Q 1/00* (2006.01)
(52) U.S. Cl.
USPC ................................. 269/54; 269/71; 269/296
(58) Field of Classification Search
USPC ............. 269/43, 45, 55, 54, 56, 589 R, 302.1
See application file for complete search history.

(56) References Cited

U.S. PATENT DOCUMENTS 6,019,360 A * 2/2000 Rice ............................... 269/296
2008/0203637 A1 * 8/2008 Li et al. ........................... 269/71

* cited by examiner

*Primary Examiner* — Monica Carter
*Assistant Examiner* — Melanie Alexander
(74) *Attorney, Agent, or Firm* — Altis & Wispro Law Group, Inc.

(57) ABSTRACT

A clamping apparatus for securing a workpiece is provided. The clamping apparatus includes a fixing base and a first and a second clamping device mounted on opposing sides of the fixing base. The first clamping device includes stacked clamping sheets, each of which is moveable and comprises an inclined clamping edge for contacting the workpiece. A support assembly supports the plurality of stacked clamping sheets; and an operating member is slidable relative to the support assembly and contacting the plurality of staked clamping sheets. The operation member is capable of moving at least one of the plurality of stacked clamping sheets relative to another one when the operation member slides relative to the support assembly, and moving at least one of the inclined clamping edge toward or away from the second clamping device to accommodate workpieces of varying sizes.

19 Claims, 3 Drawing Sheets

CLAMPING APPARATUS

BACKGROUND

1. Technical Field

The present disclosure generally relates to clamping apparatus, particularly to a clamping apparatus for small electronic components.

2. Description of Related Art

Often, clamping apparatus, such as clamping fingers are used to fix electronic components in predetermined positions on a printed circuit board. However, the clamping apparatus is generally provided with a predetermined work range, and can only accommodate electronic components of a predetermined size. If electronic components of varying sizes need to be clamped, accordingly, multiple clamping apparatuses are required, increasing costs and reducing efficiency.

Therefore, there is room for improvement within the art.

BRIEF DESCRIPTION OF THE DRAWINGS

The components in the drawings are not necessarily drawn to scale, the emphasis instead placed upon clearly illustrating the principles of the present disclosure. Moreover, in the drawings, like reference numerals designate corresponding parts throughout the several views.

DETAILED DESCRIPTION

The disclosure is illustrated by way of example and not by way of limitation in the figures of the accompanying drawings in which like references indicate similar elements. It should be noted that references to "an" or "one" embodiment in this disclosure are not necessarily to the same embodiment, and such references mean at least one.

Figure 1:
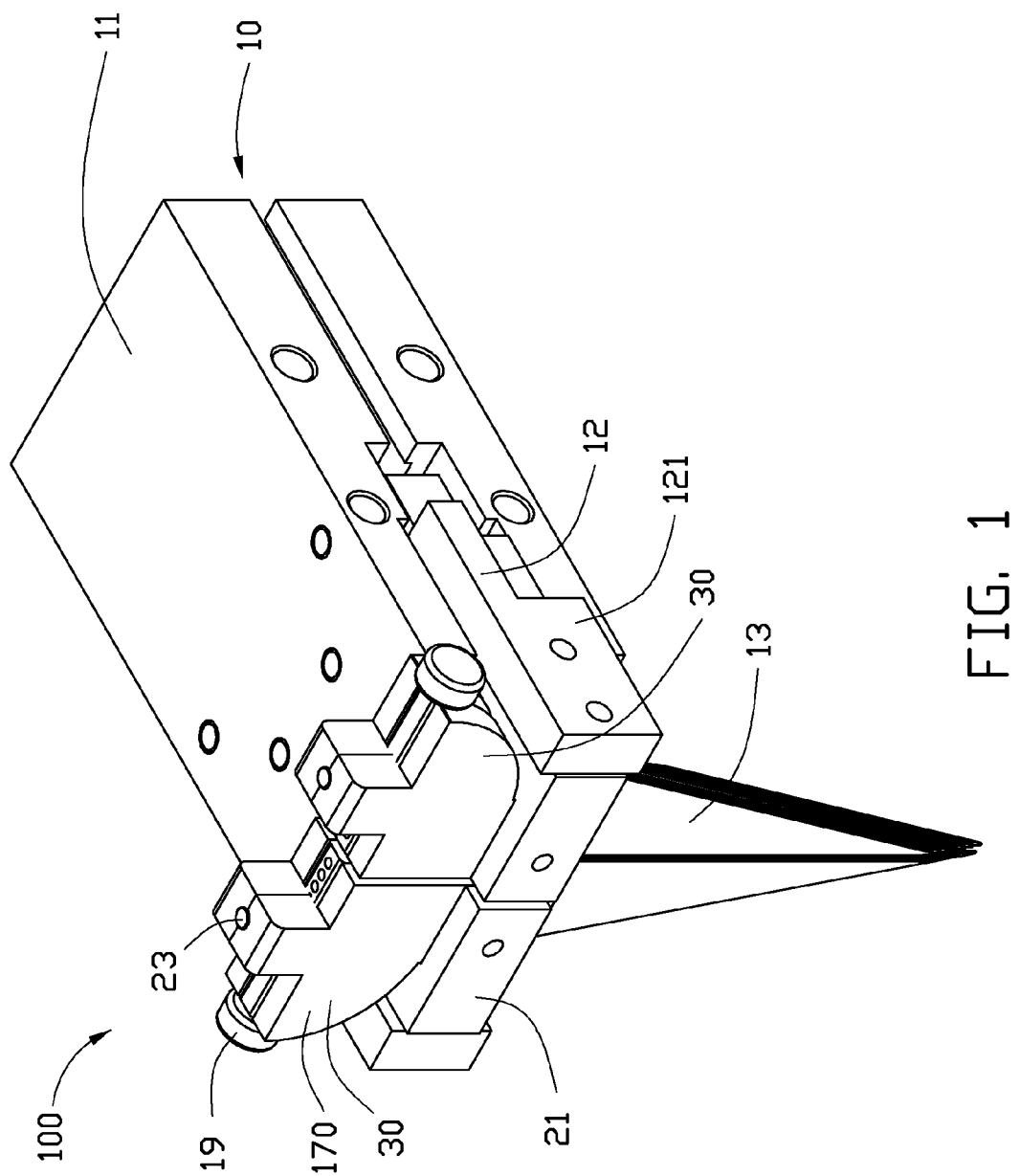
FIG. 1 is an isometric view of one embodiment of a clamping apparatus provided with a pair of clamping devices.
Figure 2:
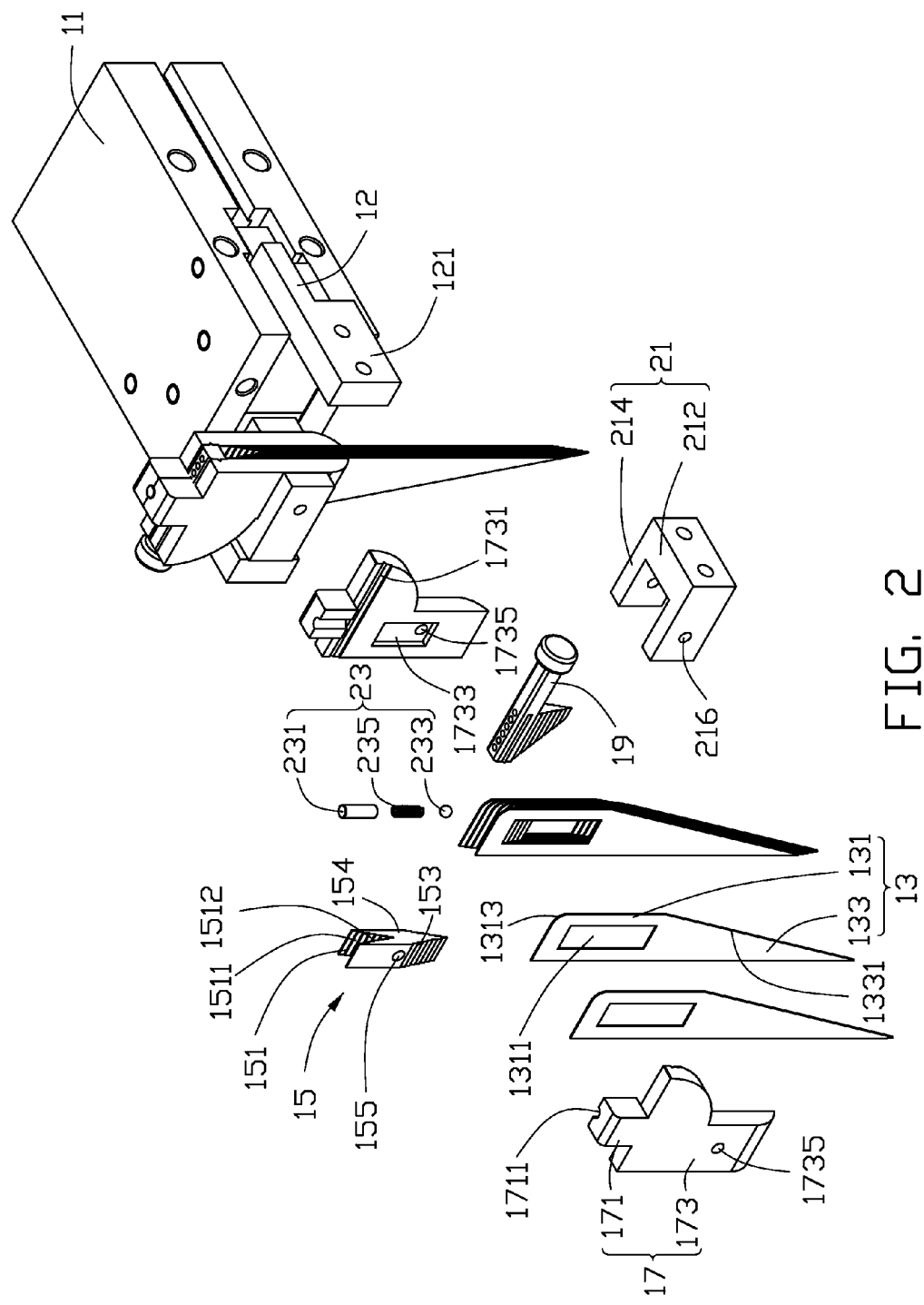
FIG. 2 is an exploded perspective view of the clamping apparatus shown in FIG. 1.

Referring to FIGS. 1 and 2, one embodiment of a clamping apparatus 100 can be connected to and operated by a manipulator (not shown). The clamping apparatus 100 is adapted to clamp and position electronic components onto a printed circuit board automatically via control of the manipulator. The clamping apparatus 100 includes a fixing base 10 and a pair of clamping devices 30 mounted on opposite sides of the fixing base 10.

The fixing base 10 includes a main body 11, two first connection members 12 fixed to the main body 11, and two second connection members 21 connected to the first connection members 12, respectively. The main body 11 can be connected to the manipulator. The two first connection members 12 are arranged on opposite sides of the main body 11, each of which has a connection portion 121 formed thereon. The second connection members 21 may be substantially U-shaped. Each second connection member 21 includes a bottom surface 212 fixed to the connection portion 121, and two sidewalls 214 substantially perpendicular to the bottom surface 212. The two sidewalls 214 are spaced from each other, and the clamping device 30 is positioned between the two sidewalls 214. Each sidewall 214 defines a first hole 216 therein.

The clamping device 30 includes a plurality of stacked clamping sheets 13, each of which is movable along a longitudinal axis, a support assembly 170, a positioning member 15, an operating member 19, and a locking assembly 23.

In this embodiment, each clamping sheet 13 is a substantially thin trapezoid sheet, and includes an engaging portion 131 defining a positioning hole 1311 therein, and a clamping portion 133 extending from the bottom of the engaging portion 131. The engaging portion 131 and the positioning hole 1311 are substantially rectangular, and the clamping portion 133 is substantially triangular. The clamping portion 133 has an inclined clamping edge 1331 along a longitudinal axis to clamp the electronic component. A top corner of the engaging portion 131 forms a first rounded corner 1313. The clamping edge 1331 and the rounded corner 1313 are located on the same side of the clamping sheet 13. Each clamping sheet 13 is provided with a plurality of sawtooth protrusions (not labeled) on the clamping edge 1331 to improve friction. It should be understood that, in other embodiments, two or more clamping sheets 13 can be deployed, with no limitation to seven as shown in FIG. 2, and the clamping edge 1331 can be coated with a layer with a higher frication coefficient than the clamping edge 1331.

The positioning member 15 defines a positioning groove 151 in a first end thereof and includes a positioning protrusion 153 extending from a second end opposite to the positioning groove 151. The positioning groove 151 is substantially V-shaped formed on top surface of the positioning member 15 and passing through two opposite sides 154 thereof. Two inclined and opposite surfaces 1511 cooperatively define the first positioning groove 151. Each surface 1511 has a plurality of parallel first stepped portions 1512 formed thereon. The positioning protrusion 153 is also substantially V-shaped and defines a second hole 155 therein.

The support assembly 170 includes two opposite support members 17. Opposite surface of the two support members 17 defines a receiving groove 1711, a guiding groove 1731 and a positioning groove 1733 beneath the guiding groove 1731. The receiving groove 1711 is formed on the top of the support member 17, and the locking assembly 23 is received between the receiving grooves 1711 of the two support members 17. The guiding groove 1731 is perpendicular to and communicates with the receiving groove 1711. The positioning member 15 is partially received between the guiding grooves 1731 of the two support members 17. The bottom surface of the positioning groove 1733 defines a third hole 1735 therein corresponding to the first and second holes 216, 155.

Figure 3:
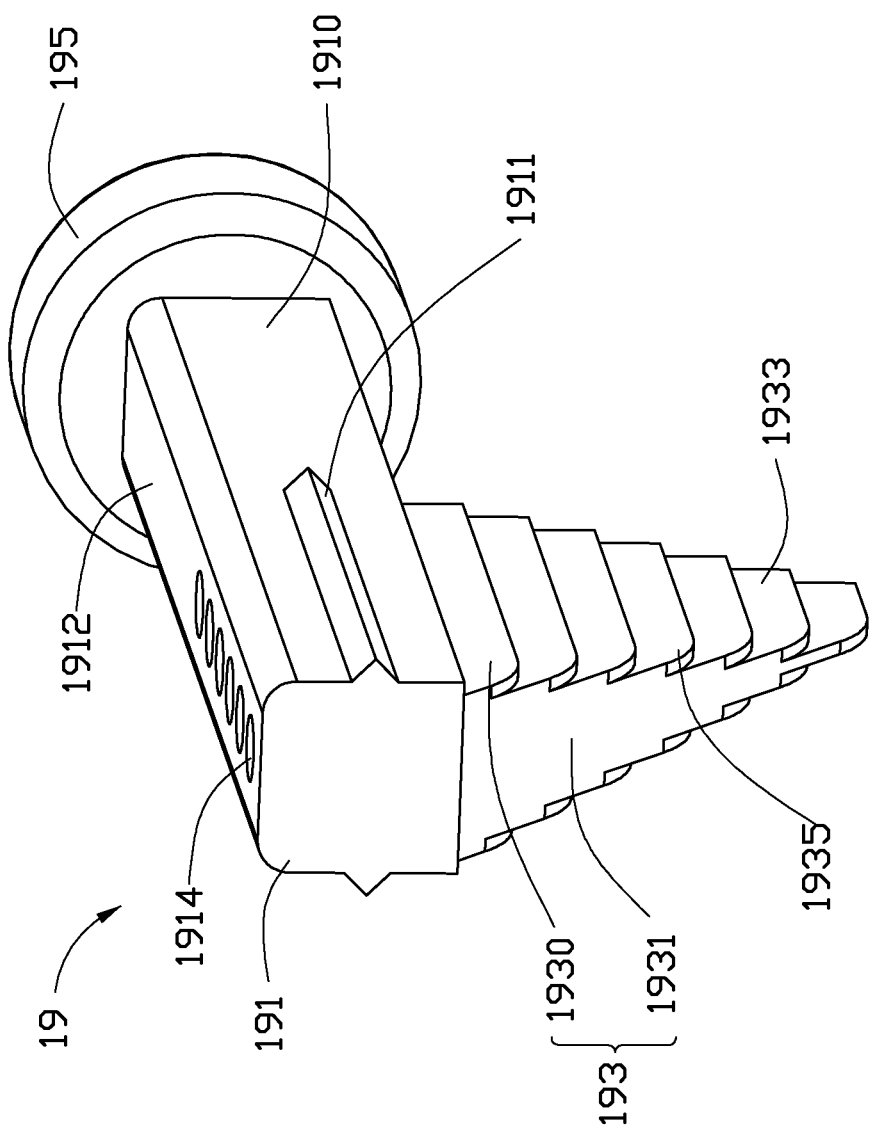
FIG. 3 is an isometric view of an operating member of the clamping apparatus of FIG. 1.

Referring to FIG. 3, the operating member 19 includes a slide bar 191, a contact portion 193 and an operating portion 195 formed on opposite ends of the slide bar 191. The slide bar 191 is substantially cuboid, and includes opposite side surfaces 1910 and a top surface 1912 adjoining the side surfaces 1910. Each of the side surfaces 1910 has a guiding protrusion 1911 formed thereon corresponding to the guiding groove 1731 on the support member 17 (see FIG. 2). The top surface 1912 defines a plurality of locking holes 1914 thereon to receive the locking assembly 23. In one embodiment, the plurality of locking holes 1914 is arranged in a line at predetermined intervals.

The contact portion 193 is a substantially pyramid and includes a first contact surface 1931 and two second contact surfaces 1930 extending from opposite sides of the first contact surface 1931. The cross section perpendicular to the sliding direction of the contact portion 193 is substantially V-shaped corresponding to the positioning groove 151 of the positioning member 15. The first contact surface 1931 is inclined toward the end of the slide bar 191 with the operating portion 195. The inclined angle formed by the first contact surface 1931 and the extending direction of the slide bar 191 is less than 90°. In one embodiment, the inclined angle is about 45°. Each second contact surface 1930 has a plurality of substantially parallel second stepped portions 1933 formed thereon corresponding to the first stepped portions 1512 formed on the positioning member 15. Each stepped portion 1933 has a rounded corner 1935 in the end adjacent to the contact surface 1931.

The locking assembly 23 includes a sleeve 231 with a top wall (not labeled), a ball 233 partially received in the sleeve 231, and an elastic member 235 received in the sleeve 231 biasing the ball 233. In one embodiment, the elastic member 235 is a coil spring.

Referring to FIG. 1 through 3, to assemble the clamping device 30, the clamping sheets 13 are stacked, and the positioning member 15 received in the positioning holes 1311 of the clamping sheets 13, which thus contact the positioning groove 151 of the positioning member 15. The positioning member 15 is positioned between the two support members 17 and received between the positioning grooves 1733. The operating member 19 positioned between the two support members 17, with the guiding protrusions 1911 slidably received in the guiding grooves 1731, respectively, and the contact portion 193 facing the clamping sheets 13. The sleeve 231 of the locking assembly 23 is fixed between the two receiving grooves 1711, and the ball 233 is engaged into a locking hole 1914 to lock the operating member 19.

After assembly, the clamping device 30 is arranged between the two sidewalls 214 of the second connection member 21, and a fastener (not shown) is received in the first, second and third holes 216, 1735, 155 in order, to fix the clamping device 30 to the fixing base 10.

Here, an electronic component having a positioning hole (not shown) therein is used as an example to illustrate operation of clamping apparatus 100.

The clamping apparatus 100 is mounted to a manipulator (not shown), and two actuators of the manipulator are connected to the operating portions 195 to control movement thereof. The manipulator moves the clamping apparatus 100 to a position where the clamping portions 133 of the clamping sheets 13 are received in the positioning hole, without contacting the inner sides of the positioning hole. Each actuator slides the operating member 19 along the guiding grooves 1731. In one embodiment, the two operating portions 195 are moved toward or away form each other via action of corresponding actuators.

Since the contact portion 193 of the operating member 19 is a substantially reverse pyramid, and the first contact surface 1931 is inclined, as the operating member 19 slides relative to the support assembly 170, the contact portion 193 resists the clamping sheets 13 gradually, and accordingly, the clamping sheets 13 are forced to contact the corresponding first stepped portions 1512 of the positioning member 15 via the action of the second stepped portions 1933.

The displacements of the clamping sheets 13 are different corresponding to the position of second stepped portion 1933. The clamping sheets 13 arranged in the middle have a higher displacement, arranged on two sides having lower placement, thus the clamping edges 1331 of the clamping sheets 13 substantially form a pyramid. The pair of clamping sheets 13 having the highest displacement contact the inner sides of the positioning hole of the electronic component, thus clamping the electronic component. In such a manner, the distance between the two clamping sheets 13 received in the positioning hole in the electronic component can be adjusted by controlling the movement of the operating member 19 to accommodate positioning holes of varying sizes. As the operating member 19 moves to a predetermined position, the clamping sheets 13 are retained in the current position via the engagement of the ball 233 of the locking assembly 23 and a corresponding locking hole 1914 in the operating member 19.

When the operating member 19 is withdrawn and disengages from the staked clamping sheets 13, the clamping sheets 13 can be moved along a longitudinal direction by external force. So that, when the manipulator moves the bottom end of the clamping sheets 13 to contact a plane, the clamping sheets 13 can be moved and substantially coincide with each other via resisting force.

Alternatively, the two clamping devices 30 can be arranged on two sides of the fixing base 10, and the clamping edges 1331 of the two clamping devices 30 are toward each other.

It is believed that the present embodiments and their advantages will be understood from the foregoing description, and it will be apparent that various changes may be made thereto without departing from the spirit and scope of the disclosure or sacrificing all of its material advantages.

What is claimed is:

1. A clamping apparatus for securing a workpiece, the clamping apparatus comprising:
   a fixing base; and
   a first and a second clamping device mounted on opposing sides of the fixing base, and the first clamping device comprising:
      a plurality of stacked clamping sheets, each of which is moveable and comprises an inclined clamping edge for contacting the workpiece;
      a positioning member defining a positioning groove thereon, each of the plurality of stacked clamping sheets defining a positioning hole therein, and the positioning member is received in the positioning hole;
      a support assembly to support the plurality of stacked clamping sheets; and
      an operating member slidable relative to the support assembly and contacting the plurality of staked clamping sheets, wherein the operation member is capable of moving at least one of the plurality of stacked clamping sheets relative to another one when the operation member slides relative to the support assembly and moving at least one of the inclined clamping edge toward or away from the second clamping device to accommodate workpieces of varying sizes.

2. The clamping apparatus of claim 1, wherein the positioning groove is substantially V-shaped defined by two inclined opposite surfaces.

3. The clamping apparatus of claim 2, wherein a plurality of parallel first stepped portions is located on the two inclined opposite surfaces to contact the corresponding clamping sheets.

4. The clamping apparatus of claim 3, wherein the operating member comprises a contact portion which is a substantially pyramid and comprises an first contact surface and two second contact surfaces extending from two opposite sides of the first contact surface, and the operating member has a substantially V-shaped cross section corresponding to the positioning groove of the positioning member.

5. The clamping apparatus of claim 4, wherein an inclined angle of the first contact surface from the direction the operating member sliding along is about 45°.

6. The clamping apparatus of claim 4, wherein each second contact surface comprises a plurality of substantially parallel second stepped portions corresponding to the plurality of parallel first stepped portions.

7. The clamping apparatus of claim 6, wherein each of the plurality of stacked clamping sheets comprises a first rounded corner, located on a top corner thereof, on a side where the inclined clamping edge is located, and each of the second stepped portions comprises a second rounded corner on an end adjacent to the first contact surface, corresponding to the first rounded corner.

8. The clamping apparatus of claim 1, wherein a plurality of sawtooth protrusions is located on the inclined clamping edge.

9. The clamping apparatus of claim 1, wherein a layer with a higher friction coefficient than the inclined clamping edge is coated on the inclined clamping edge.

10. The clamping apparatus of claim 1, wherein the support assembly comprises two opposite support members, a guiding groove is located on opposite sides of the two support members, a guiding protrusion is located on opposite sides of the operating member, and the guiding protrusion is slidably received in the guiding groove.

11. The clamping apparatus of claim 1, further comprising a locking assembly mounted onto the support assembly to lock the operating member.

12. The clamping apparatus of claim 11, wherein the operating member defines a plurality of locking holes, and the locking assembly comprises a sleeve secured on the support assembly, a ball partially received in the sleeve, and an elastic member received in the sleeve biasing the ball; and the ball is capable of being secured into one of the plurality of locking holes to retain the operating member on a predetermined position.

13. The clamping apparatus of claim 12, wherein the plurality of locking holes is arranged in a line at predetermined intervals.

14. The clamping apparatus of claim 1, wherein the inclined clamping edges of the pair of clamping devices are opposite to each other.

15. The clamping apparatus of claim 1, wherein the inclined clamping edges of the pair of clamping devices are toward each other.

16. A clamping apparatus comprising:
  a manipulator comprising a pair of actuators;
  a fixing base connected to the manipulator and operated by the manipulator; and
  a pair of clamping devices mounted on opposing sides of the fixing base, each clamping device comprising:
    a plurality of stacked clamping sheets, each of which is moveable and has an inclined clamping edge;
    a positioning member defining a positioning groove thereon, each of the plurality of stacked clamping sheets defining a positioning hole therein, and the positioning member is received in the positioning hole;
    a support assembly to support the plurality of stacked clamping sheets; and
    an operating member connected to one of the pair of actuators and slidable relative to the support assembly, wherein the operating member is capable of moving at least one of the plurality of stacked clamping sheets relative to another clamping sheet to adjust the position of the inclined clamping edge of at least one of the plurality of stacked clamping sheets under control of the actuator.

17. The clamping apparatus of claim 16, wherein the inclined clamping edges of the pair of clamping devices are opposite to each other.

18. The clamping apparatus of claim 16, wherein the inclined clamping edges of the pair of clamping devices are toward each other.

19. A clamping apparatus comprising:
  a fixing base; and
  a first and a second clamping device mounted on opposing sides of the fixing base, and the first clamping device comprising:
    a plurality of stacked clamping sheets, each of which is moveable and comprises an inclined clamping edge;
    a positioning member defining a positioning groove thereon, each of the plurality of stacked clamping sheets defining a positioning hole therein, and the positioning member is received in the positioning hole;
    a support assembly to support the plurality of stacked clamping sheets; and
    an operating member slidable relative to the support assembly and contacting the plurality of staked clamping sheets, wherein the operation member is capable of moving at least one of the plurality of stacked clamping sheets relative to another one when the operation member slides relative to the support assembly, and moving at least one of the inclined clamping edge toward or away from the second clamping device.

* * * * *